(12) United States Patent
Horijon

(10) Patent No.: US 7,941,913 B2
(45) Date of Patent: May 17, 2011

(54) COMPONENT PLACEMENT UNIT AS WELL AS A COMPONENT PLACEMENT DEVICE COMPRISING SUCH A COMPONENT PLACEMENT UNIT

(75) Inventor: Joseph L. Horijon, Eindhoven (NL)

(73) Assignee: Assembleon N.V., Eindhoven (NL)

( * ) Notice: Subject to any disclaimer, the term of this patent is extended or adjusted under 35 U.S.C. 154(b) by 51 days.

(21) Appl. No.: 11/693,442

(22) Filed: Mar. 29, 2007

(65) Prior Publication Data
US 2007/0229851 A1    Oct. 4, 2007

(30) Foreign Application Priority Data

Mar. 30, 2006 (NL) .................................. 1031471
Dec. 5, 2006 (NL) .................................. 1033000

(51) Int. Cl.
*B23P 19/00* (2006.01)
(52) U.S. Cl. .......................................... 29/739; 29/740
(58) Field of Classification Search ................. 29/739, 29/740–742
See application file for complete search history.

(56) References Cited

U.S. PATENT DOCUMENTS

| | | | | |
|---|---|---|---|---|
| 4,608,494 | A * | 8/1986 | Kobayashi et al. | 250/461.1 |
| 5,559,727 | A * | 9/1996 | Deley et al. | 700/279 |
| 5,701,661 | A * | 12/1997 | van den Brink | 29/721 |
| 5,743,005 | A * | 4/1998 | Nakao et al. | 29/833 |
| 5,897,611 | A * | 4/1999 | Case et al. | 702/150 |
| 6,583,884 | B2 * | 6/2003 | Rudd et al. | 356/601 |
| 7,251,883 | B2 * | 8/2007 | Nakamura et al. | 29/834 |
| 7,594,319 | B2 * | 9/2009 | Nakamura et al. | 29/833 |

FOREIGN PATENT DOCUMENTS

| | | |
|---|---|---|
| DE | 199 44 721 A1 | 5/2000 |
| GB | 2183820 A | 6/1987 |
| JP | 61 050002 A | 3/1986 |
| WO | WO 2004/064472 A1 | 7/2004 |

* cited by examiner

*Primary Examiner* — A. Dexter Tugbang
*Assistant Examiner* — David P Angwin
(74) *Attorney, Agent, or Firm* — Foley & Lardner LLP

(57) ABSTRACT

A component placement unit for placing a component on a substrate, which component placement unit comprises at least one nozzle which is rotatable about a central axis, by means of which a component can be picked up and placed on the substrate. The component placement unit further comprises at least one sensor for determining the orientation of the component relative to the nozzle. At least one optical element is disposed between said sensor and said nozzle. A first focus plane of the optical element at least substantially coincides with the central axis of the nozzle, whilst a second focus plane substantially coincides with the sensor, wherein an image produced by means of the sensor is a contour image of the component.

11 Claims, 9 Drawing Sheets

COMPONENT PLACEMENT UNIT AS WELL AS A COMPONENT PLACEMENT DEVICE COMPRISING SUCH A COMPONENT PLACEMENT UNIT

The invention relates to a component placement unit for placing a component on a substrate, which component placement unit comprises at least one nozzle which is rotatable about a central axis, by means of which a component can be picked up and placed on the substrate, which component placement unit further comprises at least one sensor for determining the orientation of the component relative to the nozzle, as well as at least one optical element disposed between said sensor and said nozzle, wherein a first focus plane of the optical element at least substantially coincides with the central axis of the nozzle, whilst a second focus plane substantially coincides with the sensor, and wherein an image produced by means of the sensor is a contour image of the component.

The invention also relates to a component placement device comprising at least one substrate feed-in/feed-out device, at least one component feeder and at least one component placement unit.

Such a component placement unit, which is known from U.S. Pat. No. 5,559,727, is used in a component placement device in which a component is picked up by means of the nozzle and subsequently moved to a desired position over a substrate. While the component is being moved, the orientation of the component relative to the nozzle is determined by means of the sensor. Then the component is positioned at the desired location on the substrate. Since the determination of the orientation of the component relative to the nozzle takes place while the component placement unit is being moved from the component feeder to the substrate, a minimum amount of time is required for picking up and placing the component.

A drawback of the known component placement unit is that separate means must be used for obtaining information regarding the exact position at which the component is to be placed on the substrate.

The object of the invention is to provide a component placement unit by means of which the orientation of the component relative to the nozzle as well as the desired position of the component on the substrate can be determined in an accurate, quick and reliable manner.

This object is achieved with the component placement unit according to the invention in that an image of at least a part of the substrate can be produced by means of the sensor as well, wherein part of the first focus plane at least substantially coincides with the central axis of the nozzle and part of the first focus plane at least substantially coincides with the substrate.

In this way images of the component can be produced by means of the sensor for determining the orientation of the component relative to the nozzle as well as images of at least a part of the substrate. Said part is preferably the part of the substrate on which the component is to be placed. By producing an image of the substrate, the orientation of the nozzle relative to the substrate can be determined in a simple manner. The determination of the position of the component relative to the nozzle is frequently referred to as "component alignment" (CA), whilst the determination of the position of the nozzle relative to the substrate is also referred to as "board alignment" (BA).

Since it is possible to carry out component alignment as well as board alignment by means of the sensor, there is no need to use a separate sensor for the board alignment. Not only does this save the cost of an extra sensor, but in addition the use of a single sensor both for component alignment and for board alignment leads to a significantly more accurate result, inter alia because there is no need for mutual calibration of two sensors.

As both the central axis of the nozzle and the substrate are located in a first focus plane, a sharper image both of the component and of the substrate is obtained on the sensor. The deflection element is disposed between the optical element and the central axis, for example, and the optical axis extends transversely to the substrate. This makes it possible to produce an image of the component as well as the substrate without using moving parts.

It is noted that in a component placement unit which is known from GB patent application 2,183,820 a component picked up by a nozzle is rotated about the central axis, whilst light beams are emitted to the component via a number of light sources. The light beams emitted by the light sources are received by a detector. Said light beams are interrupted by the component, so that a shadow is cast on the detector by the component. From these shadow images and the associated rotational position of the nozzle, which is stored in a computer, the orientation of the component relative to the nozzle can be determined in a manner which is known per se.

A drawback of this known component placement unit is that relatively high demands are made on the light sources in order to produce as distinct a shadow of the component as possible on the detector. The component placement unit is relatively sensitive to ambient light, because this light, too, may cause a shadow effect. Moreover, the sensor is sensitive to dust particles, inter alia on the component. Furthermore, the external dimension can only be determined on a single section of the component by means of the sensor.

Since a contour of the component is directly imaged on the sensor with the component placement unit according to the invention, the position of the component with respect to the nozzle can be directly derived from the produced image. Since no use is made of the shadow, the component placement unit according to the invention is less sensitive to ambient light. Furthermore, the sensor is less sensitive to dust on the component and/or the optical element.

One embodiment of the component placement unit according to the invention is characterised in that the optical axis of the optical element extends parallel to the central axis of the nozzle, with a deflection element being disposed between the optical element and the central axis, by means of which deflection element at least one contour of the component picked up by the nozzle can be imaged on the sensor.

As the spacing between the two focus planes is relatively large in comparison with the dimension of the optical element and the sensor in a direction transversely to the optical axis, a comparatively compact component placement unit is obtained by having the central axis and the optical axis extend parallel to each other.

Another embodiment of the component placement unit according to the invention is characterised in that the optical element is telecentric.

Since the optical element is telecentric, only the rays parallel to the optical axis are used for producing an image, thereby minimising the occurrence of perspectivic effects. As a result, the contour position on the sensor, among other things, is not affected when the component is not located in the focus plane of the optical element.

Yet another embodiment of the component placement unit according to the invention is characterised in that the optical element is provided with telecentric enlarging optics.

The use of such telecentric enlarging optics makes it possible to produce images both of relatively small components and of relatively large components. The degree of enlargement of the enlarging optics can be geared to the size of the largest components to be placed by means of the component placement unit in the design of the component placement unit.

Yet another embodiment of the component placement unit according to the invention is characterised in that the telecentric enlarging optics comprise cylindrical and/or spherical lenses.

Such cylindrical and spherical lenses are relatively easy to produce from glass or plastic material. The advantage of using spherical lenses is that focussing the component in two directions extending transversely to each other is easier than in the situation where cylindrical lenses are used, which also enables component or nozzle measurements in z-directions, for example, without z-movements being required.

The advantage of cylindrical lenses is that the position tolerances may be comparatively less precise, whilst a good image can nevertheless be produced. Furthermore, such cylindrical lenses are relatively easy to produce, so that such cylindrical lenses are comparatively inexpensive.

Yet another embodiment of the component placement unit according to the invention is characterised in that a two-dimensional image of the component can be produced by means of the sensor.

By means of such a sensor an image of the overall contour of the component can be obtained, so that the position of the component with respect to the nozzle can be determined with even greater precision. If moreover an image of the substrate is produced simultaneously therewith, the time required for producing the images is reduced and consequently the measuring speed is increased. Furthermore it is possible to carry out measurements at different sectional heights. When a single sensor is used, this enhances the robustness.

Yet another embodiment of the component placement unit according to the invention is characterised in that the component placement unit comprises a light source which is located on a side of the focus plane remote from the sensor.

The light source may be practically any light source that illuminates the component to a sufficient degree and in a substantially uniform manner at every visible position for obtaining a clear of image of the contours of the component on the sensor. To obtain a uniform illumination of the component, the light source may be provided with a diffuser that diffuses the light from the light source in the direction of the sensor in transmission or reflection.

Yet another embodiment of the component placement unit according to the invention is characterised in that the optical axis and the central axis intersect.

A component picked up from the nozzle will extend substantially on either side of the optical axis over substantially the same distance in that case. The differences on either side of the optical axis determine the deflections of the centre of the component relative to the central axis of the nozzle. Such an orientation of the optical axis relative to the central axis is especially suitable for use with the comparatively small components, where the entire contour of the component can be imaged on the sensor by means of the optical element.

If the contours of relatively large components are to be determined, it is desirable that the optical axis and the central axis cross. In that case only images of those contours of the components that are located on one side of the central axis are produced by means of the sensor. By rotating the components about the central axis and producing a number of images, images of the entire contour of the component are nevertheless obtained.

The invention will now be explained in more detail with reference to the drawings, in which.

Like parts are indicated by the same numerals in the figures.

Figure 1:
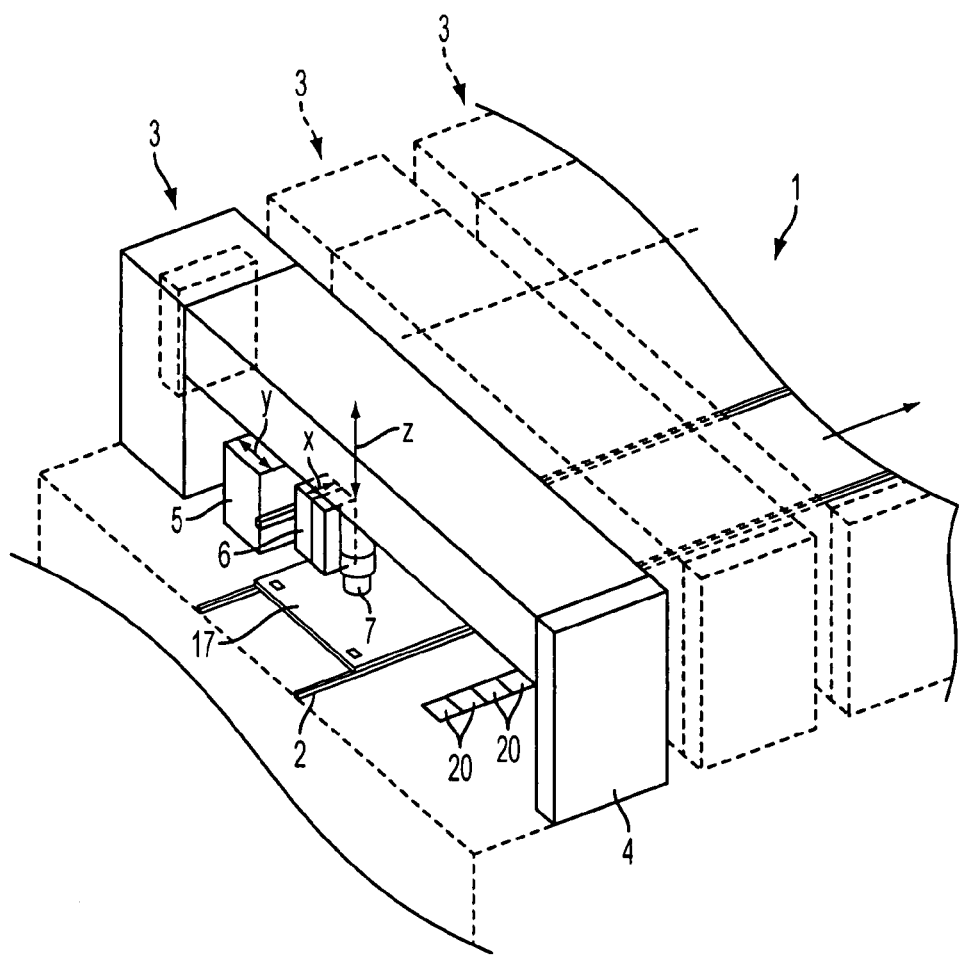
FIG. 1 is a perspective view of a part of the component placement device according to the invention.

FIG. 1 shows a perspective view of a part of a component placement device 1 according to the invention, which comprises a substrate feed-in/feed-out device 2 and three component placement units 3. Each component placement unit 3 comprises an elongated U-shaped frame 4, a first slide 5, which is movable in the direction indicated by the double arrow Y with respect to the frame 4, and a second slide 6, which is movable in the direction indicated by the double arrow X with respect to the first slide 5. The second slide 6 is provided with a nozzle 7, which is movable in the direction indicated by the double arrow Z with respect to the second slide 6. As FIG. 2 clearly shows, the nozzle 7 is rotatable in the directions indicated by the double arrow φ about the central axis 8, which extends parallel to the Z-direction. The second slide 6 is furthermore provided with an imaging device 9, an optical axis 10 of which extends parallel to the central axis 8. The imaging device 9 comprises a sensor 11, lenses 12, 13 disposed in front thereof, a deflection mirror 14 disposed partially in front of the lens 13, and a light source 15. The deflection mirror 14 includes an angle of 45° with the optical axis 10. The lenses 12, 13 form a telecentric optical element, a first focus plane 16 of which coincides with the central axis 8 of the nozzle 7. The first focus plane 16 furthermore coincides with a substrate 17 supported by the substrate feed-in/feed-out device 2. A second focus plane 18 of the optical element formed by the lenses 12, 13 coincides with the sensor 11.

The light source 15 is located on a side of the optical element 12, 13 remote from the focus plane 16 and provides a diffuse illumination, for example, of a component 19 that has been picked up by the nozzle 7, for example through the application of a vacuum.

The component 19 has been picked up by the nozzle 7 from a component supply position 20. The nozzle 7 has to that end been moved in directions indicated by the arrows X and Y in a manner which is known per se.

While the component 19 is being moved from the component supply position 20 to a desired position 21 on the substrate 17, the nozzle 7 with the component 19 adhering thereto is rotated in the directions indicated by the double arrow φ about the central axis 8. During said rotation, images of the contours of the component 19 present in the focus plane 16 are produced by means of the sensor 11 at a number of rotational positions that are known in advance. From said images of the contours the position and orientation of the component 19 with respect to the nozzle 7 can be determined by means of an of arithmetic unit. Furthermore, one or more images of the position 21 on the substrate 17 are produced by means of the sensor 11. From said images, which have been produced at a position of the slide 6 with respect to the frame 4 that is stored in an arithmetic unit, the location of the position 21 with respect to the nozzle 7 and thus of the component 19 with respect to the position 21 can be determined. Subsequently, the component 19 can be placed precisely at the desired location 21.

Since the lenses 12, 13 are located beside the central axis 8, as it were, the component 19 can be placed on the substrate 17 without there being a need to move parts of the imaging device 19. In this way it is ensured that the various elements of the component placement unit will remain correctly positioned relative to each other.

Since the contours of the component 19 are sensed by means of the sensor 11, the position and orientation of the component 19 with respect to the nozzle 7 can be determined in a relatively simple manner. Since the optical element is telecentric, a clear image of the component 19 is obtained.

Figure 3:
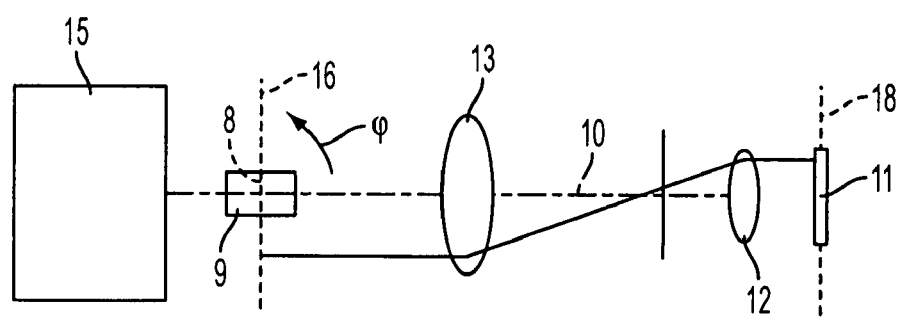
FIG. 3 is a developed plan view of the optical light path of the component placement unit shown in FIG. 2.

In the situation that is shown in FIG. 3, the central axis 8 intersects the optical axis 10. Such a position of the central axis 8 is in particular suitable for the comparatively small components 19, whose entire contour can be imaged on the sensor 11. In the case of a larger component 19, it is advisable to position the central axis 8 some distance away from the optical axis 10, with the central axis 8 still lying in the focus plane 16. In such a position, only a side of the component 19 located near the optical axis 10 will be imaged on the sensor 11. By causing the component 19 to rotate about the central axis 8, however, the position of the component 19 with respect to the central axis 8 can nevertheless be determined after a full rotation of the component and after a number of images of the contours of the component 19 have been produced.

It is also possible to provide the slide 6 with two imaging devices 9, one being intended for producing images of the component 19 and the other being intended for producing images of the substrate 21. Such alternative embodiments are shown in FIGS. 4-8.

Figure 4:
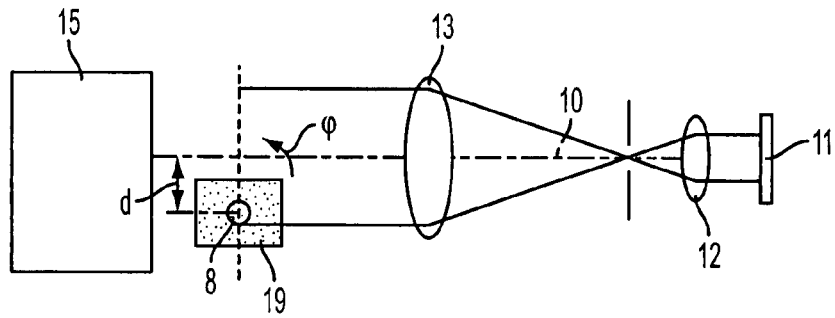
FIG. 4 is a developed plan view of the optical light path of an alternative embodiment of the component placement unit according to the invention.

FIG. 4 shows an optical light path of an alternative embodiment, in which the central axis 8 and the optical axis 10 cross and are spaced a distance d apart. Such a position of the central axis is in particular suitable for the comparatively large components 19, where the entire contour of the component 19 can nevertheless be imaged on the sensor 11 by rotating the component 19 in the direction indicated by the arrow φ.

Figure 5:
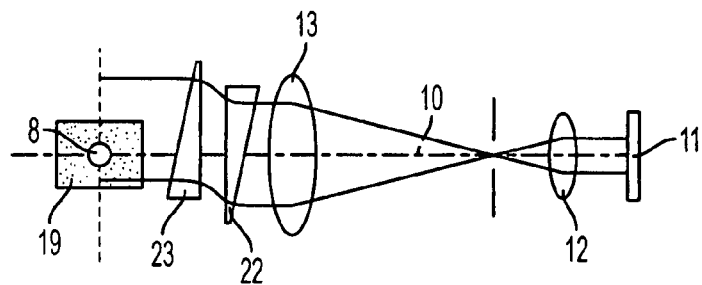
FIG. 5 is a developed plan view of the optical light path of another alternative embodiment of the component placement unit according to the invention.

FIG. 5 shows an alternative embodiment, which is different from the embodiment shown in FIG. 3 in that two prism elements 22, 23 are disposed between the lenses 12, 13 and the central axis 8, as a result of which the optical axis will cross rather than intersect the central axis 8. In this way, too, it is possible to image only one side of the component 19 on the sensor 11, whilst information regarding the entire contour of the component 19 is nevertheless obtained by rotating the component 19 in the direction indicated by the arrow φ about the central axis 8.

Figure 6:
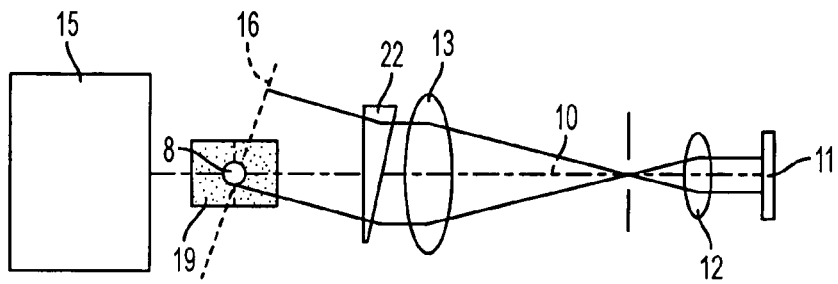
FIG. 6 is a developed plan view of the optical light path of yet another alternative embodiment of the component placement unit according to the invention.

FIG. 6 shows another alternative embodiment, which is different from the embodiment that is shown in FIG. 5 in that only a single prism 22 is used. The focus plane 16 does not extend transversely to the optical axis between the sensor 11 and the lens 13 in this embodiment, but includes an obtuse angle therewith. In such an embodiment, too, the optical axis crosses the central axis 8 and it is possible to produce images of one side of the component 19.

Figure 2:
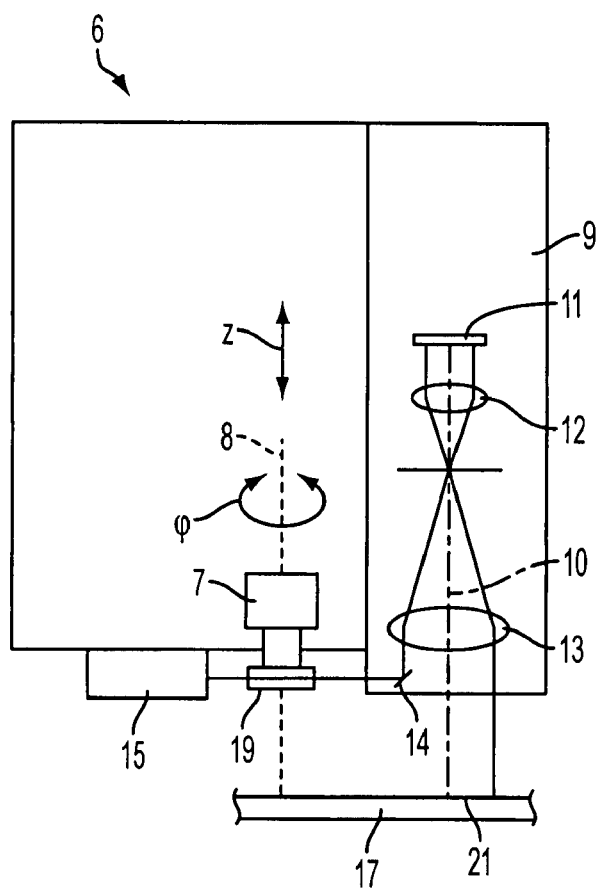
FIG. 2 is a side view of a component placement unit according to the invention as used in the component placement device of FIG. 1.
Figure 7:
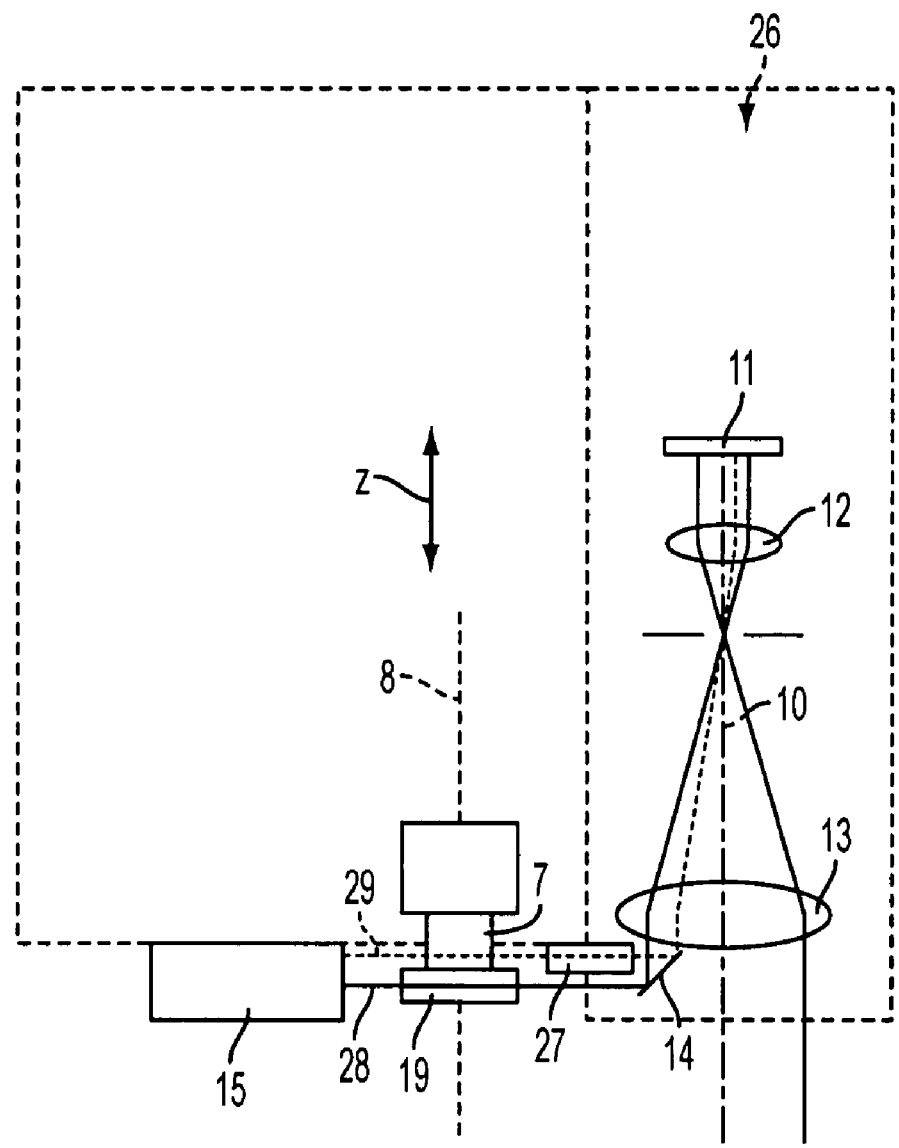
FIG. 7 is a side view of yet another alternative component placement unit according to the invention.

FIG. 7 shows an alternative embodiment of a component placement device, which comprises a slide 26. The slide 26 is different from the slide 6 that is shown in FIG. 2 in that a beam shifter 27 is disposed between the deflection mirror 14 and the nozzle 7. Such a beam shifter 27 comprises the prisms 22, 23 shown in FIG. 5, for example, or the prism 22 shown in FIG. 6.

If the contours of comparatively small components 19 are to be determined, the component 19 is positioned in a light path 28 by means of the nozzle 7, with only the deflection mirror 14 being disposed between the component 19 and the lens 13. If a comparatively large component 19 is to be placed, said component 19 is moved upwards in a Z-direction by means of the nozzle 7, with the component 19 being positioned in the light path 29. Not only the deflection mirror 14 but also the beam shifter 27 is disposed between the component 19 and the lens 13 in that case. In this way it is possible either to image the entire contour of the component directly on the sensor 11 or the contours of one side of the component 19, depending on the size of the component 19 to be placed. Information about the entire component is nevertheless obtained by rotating the component and producing a number of images.

Figure 8:
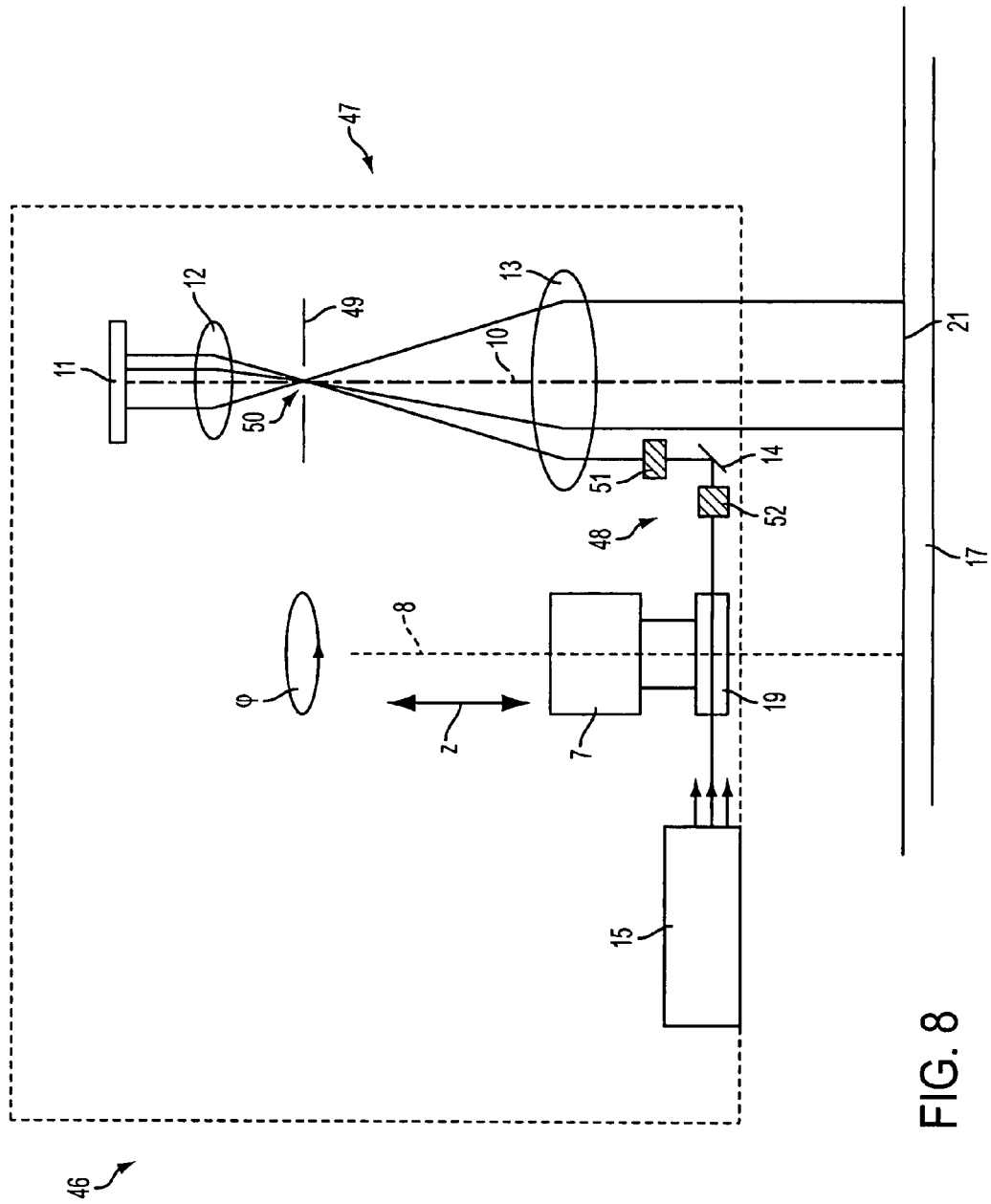
FIG. 8 is a side view of another embodiment of a component placement unit according to the invention, which can be used in the component placement device shown in FIG. 1.

FIG. 8 shows yet another embodiment of a component placement device according to the invention, which comprises a slide 46. The slide 46 is different from the slide 6 shown in FIG. 2 in that the optical element 47 comprises telecentric enlarging optics 48 in addition to the lenses 12, 13. As is furthermore clearly shown in FIGS. 2-8, a stop plate 49 is disposed between the lenses 12, 13, which stop plate is provided with a relatively small passage 50.

Figure 9:
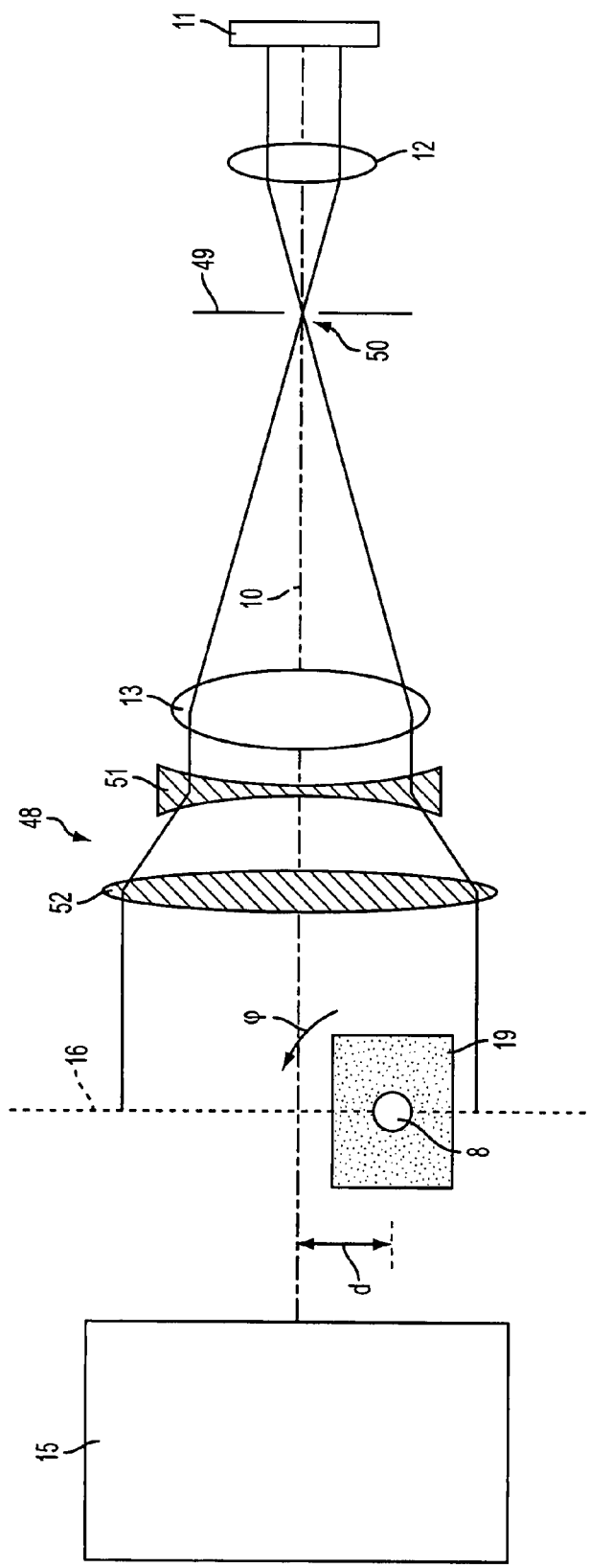
FIG. 9 is a developed plan view of the optical light path of the component placement unit shown in FIG. 8.

As is shown more clearly in FIG. 9, the telecentric enlarging optics 48 comprises two spherical lenses 51, 52. A deflection mirror 14 is disposed between the lenses 51, 52. The telecentric enlarging optics 48 make it possible to pick up a comparatively large component 19 by means of the nozzle 7, at least one side of which component 19 can be imaged on the sensor 11. In this embodiment, the component 19 may be considerably larger than, for example, in the embodiment shown in FIG. 4. If comparatively small components 19 are to be picked up by means of the nozzle 7, the entire component 19 will be imaged on the sensor 11 by means of the embodiment that is shown in FIGS. 8 and 9.

Figure 10:
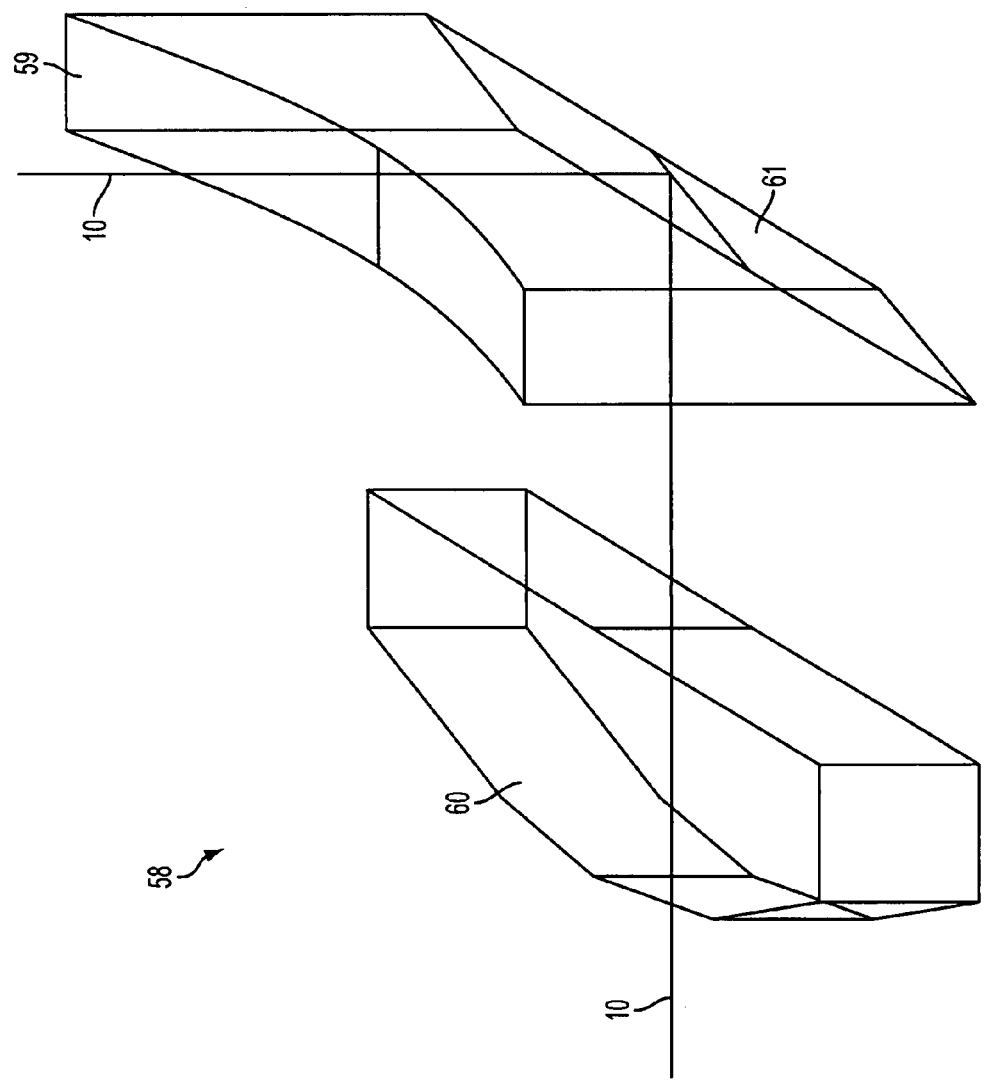
FIG. 10 is a perspective view of another embodiment of concentric enlargement optics as used in the component placement unit according to the invention that is shown in FIG. 8.

FIG. 10 shows an alternative embodiment of a telecentric enlarging optics 58, which comprises two cylindrical lenses 59, 60. The cylindrical lens 59 has been ground at an angle of 45° at a bottom side, as a result of which a plane 61 that functions as a deflection mirror has been obtained. The advantage of such a deflection mirror is that the telecentric enlarging optics 58 is less sensitive to dust, since there are fewer exposed optical surfaces.

The lenses 12, 13 as well as the lenses 51, 52, 59, 60 may be made of plastic or glass.

The advantage of the spherical lenses 51, 52 is that is the images of the component 19 are in focus in both directions extending transversely to each other, so that it is also possible to carry out measurements on the component 19 or the nozzle 7 in the z-direction without there being a need to move the component 19 in the z-direction.

The enlargement factor of the telecentric enlarging optics 48, 58 between the lens 13 and the focus plane 16 can be determined in a simple manner by the designer himself, into alia in dependence on the largest component 19 that is to be picked up and placed by means of the component pick-up unit.

An important factor when using telecentric enlarging optics 48, 58 is that the central axis 8 about which the component 19 is rotated in the direction indicated by the arrow (p be located in the first focus plane 16. Preferably, the central axis does not coincide with the optical axis 10 in that case, so that it is possible to sense comparatively small components 19 as well as comparatively large components 19 by means of the sensor 11. Small components 19 only need to be rotated 180° in order to obtain a complete image of the component 19. Comparatively large components 19 must preferably be rotated 360° in order to be able to sense all the sides of the component 19.

In the embodiment shown in FIG. 8, the optics by which the desired position 21 is sensed need not be telecentric. To enable adequate sensing of the component 19, however, a stop plate 49 provided with a comparatively small passage 50 needs to be present, and the imaging of the component 19 must take place by telecentric means.

According to another possibility, the telecentric enlarging optics may comprise mirrors instead of lenses.

Preferably, all the components present in the slide 46 are integrated, making it possible to realise a comparatively small slide 46 with precise manufacturing tolerances. It is furthermore possible in this connection to integrate the electronics required for controlling the various components and the electronics required for processing the information obtained from the sensor 11. In this way a further reduction of the cost price is realised.

Figure 11:
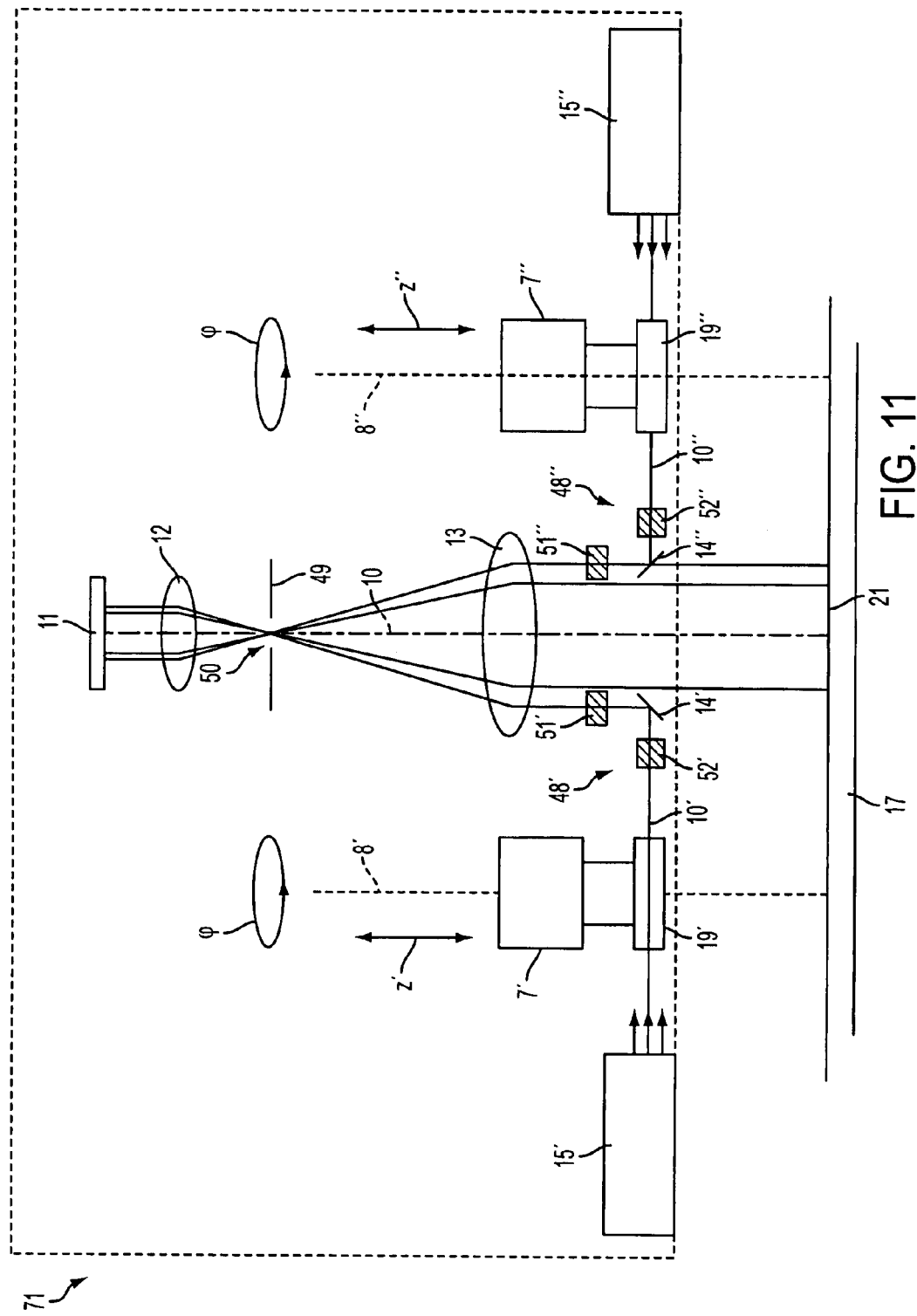
FIG. 11 is a side view of another embodiment of a component placement unit according to the invention.

FIG. 11 shows a side view of a component placement unit 71 according to the invention, which is different from the component placement unit of FIG. 8 in that it comprises nozzles 7', 7" located on either side of the optical axis 10, which are rotatable in the directions indicated by the double arrow is 4', 4" about central axes 8', 8" extending parallel to the z', z" directions. The component placement unit 71 further comprises two light sources 15', 15", which each illuminate a component 19', 19" picked up by a nozzle 7', 7". The component placement unit 71 comprises a sensor 11, lenses 12, 13 disposed in front thereof, a stop plate 49 disposed between the sensor 11 and the lenses 12, 13, and telecentric enlarging optics 48', 48" disposed between the lens 13 and the respective light source 15', 15". Like the telecentric enlarging optics 48, the enlarging optics 48', 48" are provided with lenses 51', 52', 51", 52" and a deflection mirror 14', 14" disposed between the lenses. Two components can be picked up and placed simultaneously or sequentially by means of the component placement unit 71, whilst the components 19', 19" can be sensed simultaneously by means of the sensor 11. An image of a position 21 of the substrate 17 can be produced simultaneously with said sensing of the components 19', 19". The optical axes 10', 10" may intersect or cross the central axes 8', 8".

Figure 12:
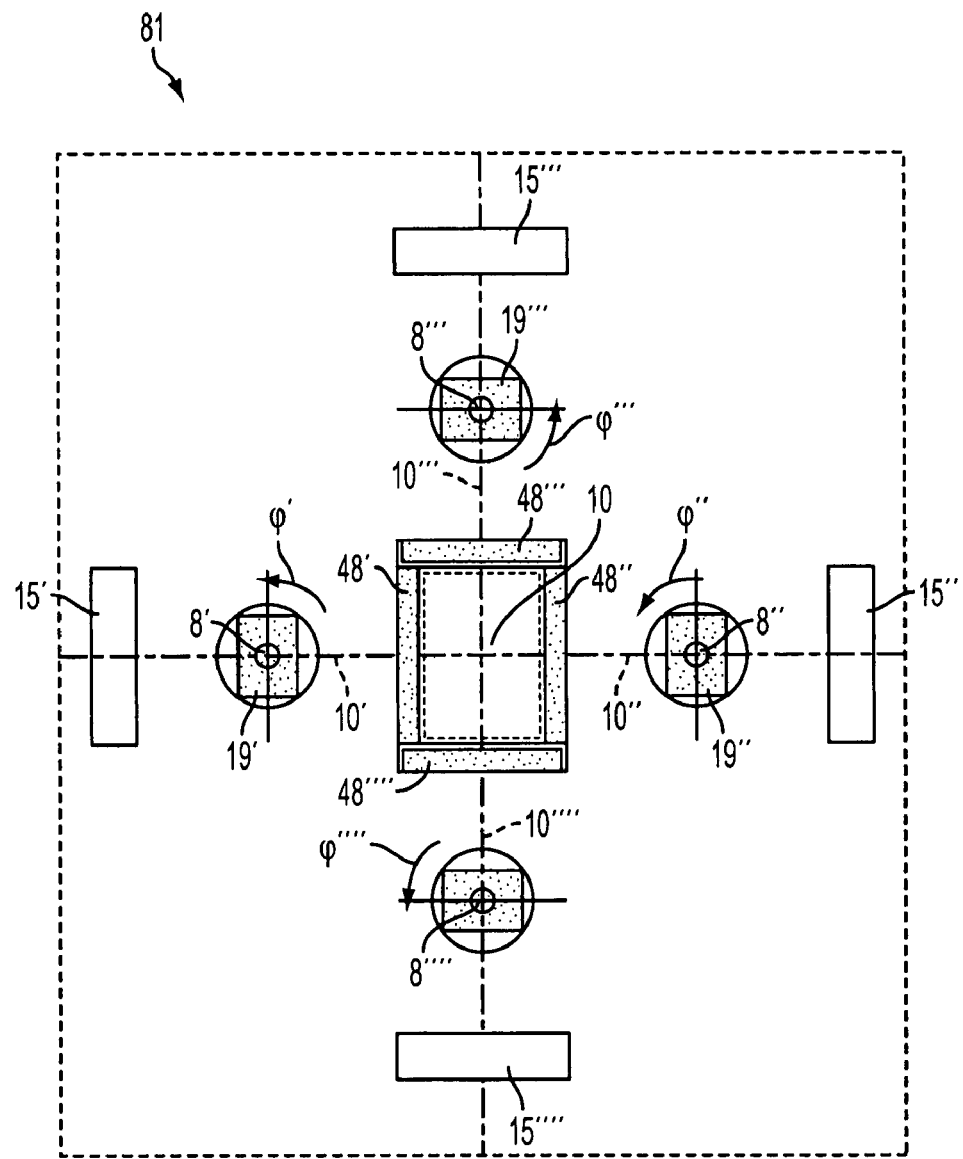
FIG. 12 is a plan view of yet another embodiment of a component placement unit according to the invention.

FIG. 12 is a plan view of a component placement unit 81, which is different from the component placement unit 71 in that it comprises four instead of two nozzles 7 and associated light sources 15 and telecentric enlarging optics 48. In FIG. 12 the various components of the four units are indicated ', ", "' and "", respectively. The component placement unit 81 makes it possible to produce images of four components 19 and of a position 21 on a substrate 17 simultaneously. In the component placement unit 81 shown in FIG. 12, the optical axes 10', 10", 10"', 10"" intersect the central axes 8', 8", 8"', 8"".

The optical axes 10 may also cross the central axes 8, of course, as is the case in the embodiment of FIG. 8. It is also possible, of course, to leave out the telecentric enlarging optics 41 at one or more of the four positions, for example in the case that only comparatively small components are to be picked up with a particular nozzle 7.

The invention claimed is:

1. A component placement unit for placing a component on a substrate, which component placement unit comprises:
    at least one nozzle which is rotatable about a central axis and configured to pick up and place the component on the substrate; and
    an imaging device including:
        at least one sensor for determining an orientation of the component relative to the nozzle, and
        at least one optical element disposed in a light path between said sensor and said nozzle,
    wherein a first part of a first focus plane of the optical element extends parallel to the central axis of the nozzle and is positioned so that the central axis of the nozzle lies in the first part of the first focus plane, the first part of the first focus plane extends transversely to the substrate,
    wherein a second part of the first focus plane extends parallel to the substrate and is positioned so that the substrate lies in the second part of the first focus plane, the substrate extends transversely to the central axis,
    wherein a second focus plane of the optical element substantially coincides with the sensor so that the sensor lies in the second focus plane, and
    wherein an image produced by using the sensor is a contour image of the component, wherein an image of at least a part of the substrate can be produced by using the sensor as well.

2. A component placement unit according to claim 1, wherein the optical axis of the optical element extends parallel to the central axis of the nozzle, with a deflection element being disposed between the optical element and the central axis and configured to image on the sensor at least one contour of the component picked up by the nozzle.

3. A component placement unit according to claim 1, wherein the optical element is telecentric.

4. A component placement unit according to claim 3, wherein the optical element is provided with telecentric enlarging optics.

5. A component placement unit according to claim 4, wherein the telecentric enlarging optics comprise at least one of cylindrical and spherical lenses.

6. A component placement unit according to claim 1, wherein a two-dimensional image of the component can be produced by using the sensor.

7. A component placement unit according to claim 1, wherein the component placement unit comprises a light source which is located on a side of the first part of the first focus plane remote from the sensor.

8. A component placement unit according to claim 1, wherein the optical axis of the optical element and the central axis intersect.

9. A component placement unit according to claim 1, wherein the optical axis of the optical element and the central axis cross.

10. A component placement device comprising at least one substrate feed-in and feed-out device, at least one component feeder, and at least one component placement unit according to claim 1.

11. A component placement unit according to claim 1, wherein the imaging device is configured such that no part of the imaging device is disposed between the nozzle and the substrate.

* * * * *